US007541626B2

(12) United States Patent
Kim et al.

(10) Patent No.: US 7,541,626 B2
(45) Date of Patent: Jun. 2, 2009

(54) HIGH K-GATE OXIDE TFTS BUILT ON TRANSPARENT GLASS OR TRANSPARENT FLEXIBLE POLYMER SUBSTRATE

(75) Inventors: Il-Doo Kim, Seoul (KR); Harry L. Tuller, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 401 days.

(21) Appl. No.: 11/391,034

(22) Filed: Mar. 28, 2006

(65) Prior Publication Data
US 2006/0234852 A1  Oct. 19, 2006

Related U.S. Application Data

(60) Provisional application No. 60/665,672, filed on Mar. 28, 2005, provisional application No. 60/755,812, filed on Jan. 3, 2006.

(51) Int. Cl.
*H01L 29/745* (2006.01)
*H01L 21/336* (2006.01)
(52) U.S. Cl. ............... 257/213; 438/287; 257/E21.269; 257/E21.271; 257/262; 257/274
(58) Field of Classification Search .................. 438/82, 438/99, 287; 257/40, 262, 274, E21.269, 257/E21.272; 313/504, 506; 428/690, 917
See application file for complete search history.

(56) References Cited

U.S. PATENT DOCUMENTS

| 6,207,472 | B1   | 3/2001  | Callegari et al. |
| 6,358,378 | B2   | 3/2002  | Choi et al. |
| 6,720,119 | B2 * | 4/2004  | Ohtsu et al. ................... 430/7 |
| 6,727,522 | B1   | 4/2004  | Kawasaki et al. |
| 6,878,962 | B1   | 4/2005  | Kawasaki et al. |
| 2002/0060325 | A1 * | 5/2002 | Yano et al. .................. 257/103 |
| 2002/0086507 | A1 * | 7/2002 | Park et al. ................... 438/585 |
| 2003/0218222 | A1   | 11/2003 | Wager, III et al. |
| 2004/0056273 | A1   | 3/2004  | Nause et al. |
| 2006/0115964 | A1 * | 6/2006  | Findikoglu et al. .......... 438/509 |

OTHER PUBLICATIONS

"Enhancement-mode thin-film field-effect transistor using phosphorus-doped (Zn, MG)O channel"; Jwib et al., Applied Physics Letters; vol. 84, No. 14; pp. 2685-2687, Apr. 5, 2004.
"ZnO-channel thin-film transistors: Channel mobility"; Hoffman et al.,; Journal of Applied Physics; vol. 95, No. 10; May 15, 2004; pp. 5813-5819.
"All oxide transparent MISFET using high-k dielectrics gates"; Nomura et al.,; Micro Electronic Engineering; pp. 294-298.
"Low-voltage ZnO thin-film transistors with high-k $Bi_{1.5}Zn_{1.0}Nb_{1.5}O_7$ gate insulator for transparent and flexible electronics"; Kim et al.,; Applied Physics Letters 87; 2005 American Institute of Physics.
"Wide-bandgap high-mobility ZnO thin-film transistors produced at room temperature"; Fortunato et al.,; Applied Physics Letters; vol. 85, No. 13; Sep. 27, 2004; pp. 2541-2543.
"Transparent conducting zinc oxide thin film prepared by off-axis rf magnetron sputtering"; Jayaraj et al.,; Indian Academy of Sciences; vol. 25, No. 3, Jun. 2002; pp. 227-230.
"Fully transparent ZnO Thin-Film Transistor Produced at Room Temperature"; Fortunato et al.,; Advanced Materials; Adv. Mater. 2005, vol. 17, No. 5; pp. 590-594.

* cited by examiner

*Primary Examiner*—Hsien-ming Lee
(74) *Attorney, Agent, or Firm*—Gauthier & Connors LLP

(57) ABSTRACT

A transparent thin film transistor device includes a transparent substrate, and a high dielectric constant insulator layer disposed over the transparent substrate at a defined temperature. A transparent semiconductor layer is disposed over the insulator layer.

22 Claims, 5 Drawing Sheets

FIG. 5A
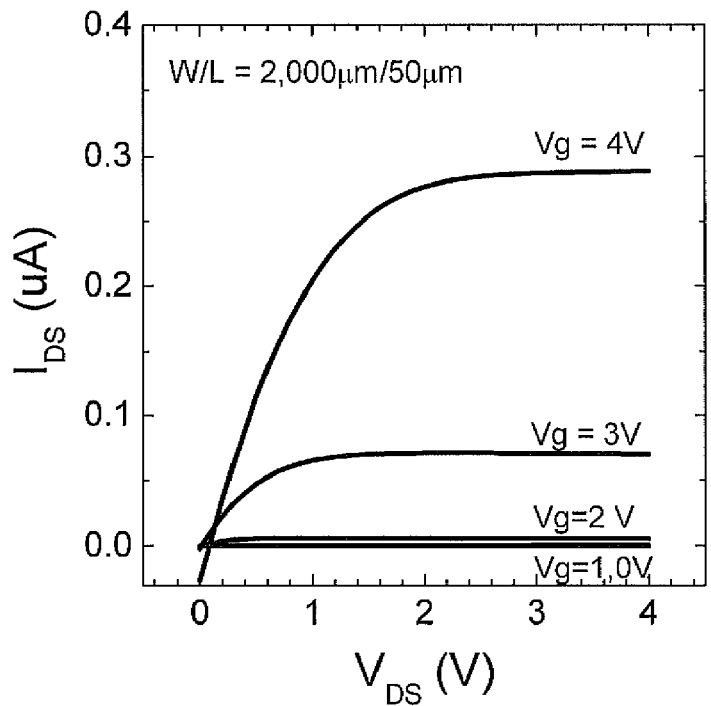
(b)
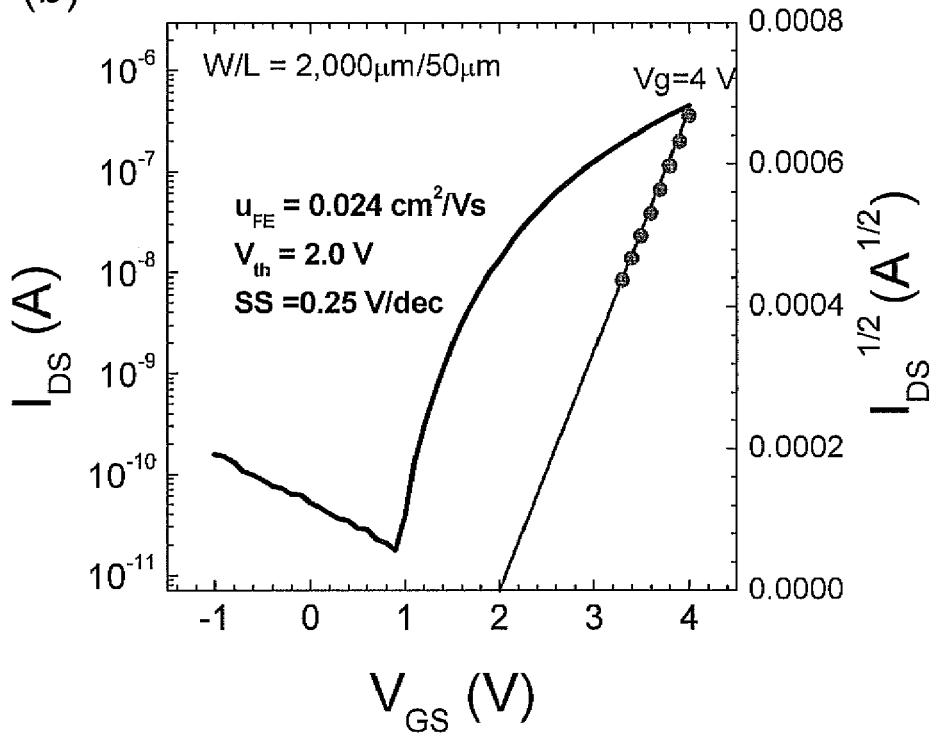
FIG. 5B

HIGH K-GATE OXIDE TFTS BUILT ON TRANSPARENT GLASS OR TRANSPARENT FLEXIBLE POLYMER SUBSTRATE

PRIORITY INFORMATION

This application claims priority to provisional applications Ser. No. 60/665,672 filed Mar. 28, 2005, and Ser. No. 60/755,812 filed Jan. 3, 2006, both of which are incorporated herein by reference in their entireties.

BACKGROUND OF THE INVENTION

The invention relates to the field of transistors, and in particular the fabrication of near room temperature processed high-K and low dielectric loss transparent transistor circuits using transparent high-K gate insulators.

Organic light emitting diodes (OLEDs) are of great interest due to their potential application in flat panel displays. More significantly, the hydrogenated amorphous silicon (a-Si:H) active matrix is a very promising technology for back-plane electronics for a new generation of displays based on OLEDs on transparent glass substrates. Amorphous Si has an advantage of lower processing costs despite its lower mobility compared to poly-Si.

Although there have been successful demonstrations of flexible OLED's fabricated on plastic substrates, the fabrication of a-Si transparent flexible transistor (TFT) on plastics has proven difficult due to mechanical and chemical instabilities of such substrates at the processing temperatures typically needed for a-Si transparent flexible transistor TFT (~300° C.). For Active Matrix OLEDS (AMOLED) applications, $SiN_x$ gate dielectrics are commonly used for TFT fabrication. However the low dielectric constant of $SiN_x$ requires higher driver voltages, not compatible with battery powered wearable and portable devices. Currently, OLEDs can be made to emit light from bottom and top surfaces.

AMOLED displays have a transistor driver supplying a constant current source at each pixel with one switching TFT to program. Hence, AMOLED display pixels need a minimum of two TFTs to control the drive current. The transistor is used to separate the effect of the data line voltage and the address line voltage on the voltage across the OLED material. Each pixel with p-channel transistor is programmed to provide a constant current. Amorphous silicon and polycrystalline silicon are commonly used for AMOLEDs. Both of these materials are compatible with large area glass substrate processes, however, poly-Si technology is expensive compared to amorphous-Si technology even though poly-Si has much higher mobility. In terms of process temperature, amorphous-Si has an advantage. OLED display technology offers better viewing angles, more resolution and less power consumption than traditional LCD displays.

SUMMARY OF THE INVENTION

According to one aspect of the invention, there is provided a transparent thin film transistor device including a transparent substrate, and a high dielectric constant insulator layer disposed over the transparent substrate at a defined temperature. A transparent semiconductor layer is disposed over the insulator layer.

According to another aspect of the invention, there is provided a method of developing a transparent thin film transistor device. The method includes providing a transparent substrate, and forming a high dielectric constant insulator layer disposed over the transparent substrate at a defined temperature. Moreover, the method includes forming a transparent semiconductor layer disposed over the insulator layer.

BRIEF DESCRIPTION OF THE DRAWINGS

FIG. 5A is a graph demonstration the drain-to-source current ($I_{DS}$) as a function of drain-to-source voltage ($V_{DS}$) at indicated gate-to-source voltages ($V_{GS}$) of a ZnO TFT; FIG. 5B is a graph demonstration the log drain-to-source current ($I_{DS}$) and square root of drain-to-source current ($I_{DS}$) as a function of gate-to-source voltage ($V_{GS}$) at drain-to-source voltage ($V_{DS}$) of 4 V of a ZnO TFT.

DETAILED DESCRIPTION OF THE INVENTION

Figure 1:
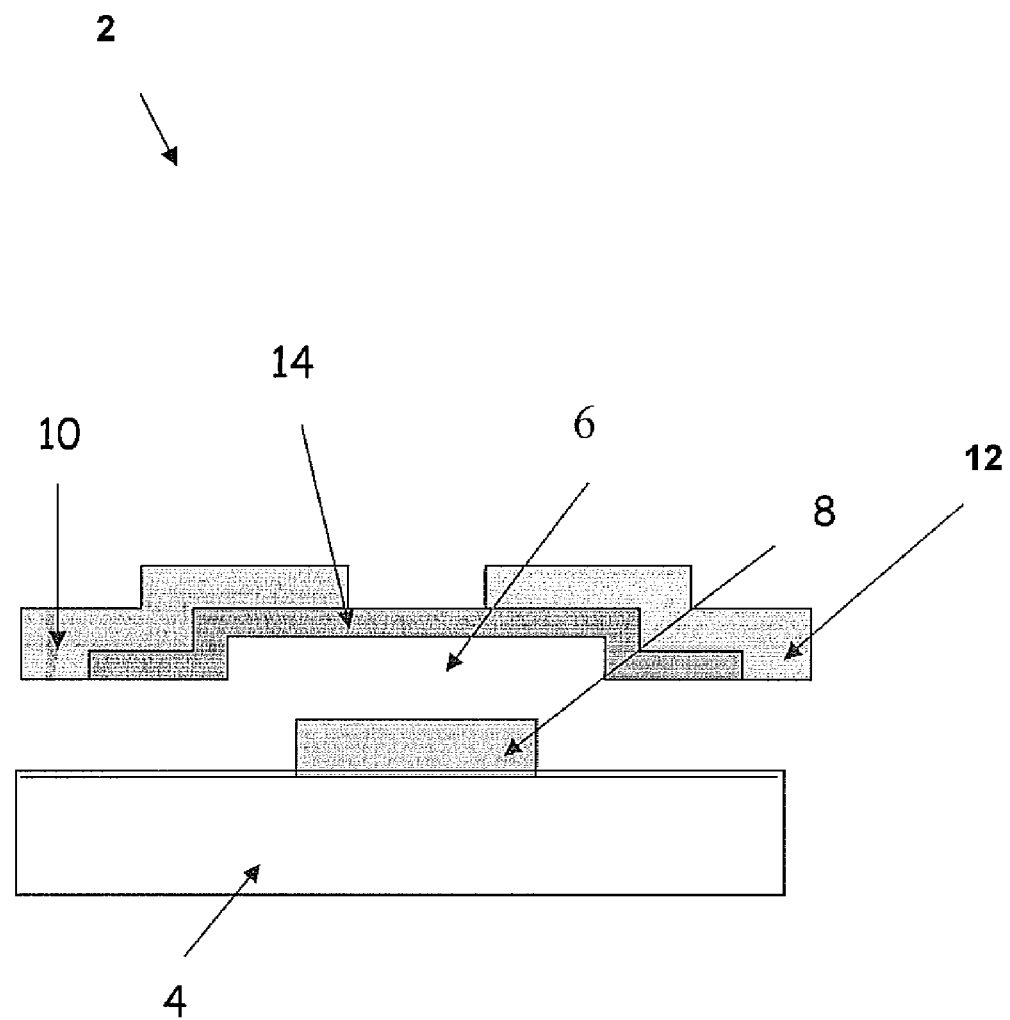
FIG. 1 is a schematic diagram of an exemplary transparent flexible transistor (TFT) in accordance with the invention.

The invention relates to forming high K-dielectrics $Bi_{1.5}Zn_{1.0}Nb_{1.5}O_7$ (BZN series, $A_2B_2O_7$ structure materials) at room temperature and transparent transistors having transparent BZN thin films with high (>80%) optical transmittance. Specifically, one can demonstrate low voltage operating transparent flexible transistors (TFTs) performance by achieving relative dielectric constants of 50-55 and low leakage current density less than $10^{-7}$ A/cm$^2$ at an applied voltage of 5 V. Also high dielectric constant and low dielectric loss at high frequency range makes room temperature processed BZN films applicable for thin film embedded capacitor High-K gate oxides with high dielectric constant and low leakage current density can be used as a gate oxide to offer low voltage operation for a thin film transistor 2 (TFT), as shown in FIG. 1. The TFT 2 includes a transparent substrate 4, a source 10, a drain 12, an active channel 14, a gate oxide 6, and a gate 8. In this embodiment of the invention, the source 10 and drain 12 can comprise Al and the gate 8 can comprise Cr, however other similarly situated materials can be used for the source 10, drain 12, and gate 8. Note the gate 8 is totally surrounded by the gate oxide 6.

The invention proposes in-situ growth of a High-K gate oxide 6 to form TFTs, such as BZN films with amorphous structure, onto a transparent substrate 4 at reduced temperatures. For compatibility with a-Si TFT's, high-K oxide layer 6 growth can be achieved at 300~400° C. with excellent low leakage characteristics. If required for compatibility with low cost polymer substrates, growth at or at or near room temperature is possible with some increase in leakage current. After the BZN growth, a semiconductor layer is, such as a-Si:H, poly-Si, p-channel pentacene semiconductor or n-channel semiconductor, is deposited on top of the high-K oxide layer 6 to form the active channel 14. The n-channel semiconductor can include ZnO or $InGaO_3$. The transparent substrate 4 can include glass and plastic substrates from the following: PET, PEN, PES, Polyimide, or the like. Note the source 10 and drain 12 are formed on the active channel 14.

The high-K gate oxide layer 6 can include at least one material selected from the group consisting of $Bi_2(Zn_{1/3}Nb_{2/3})_2O_7$, $Bi_{1.5}Zn_{1.0}M_{1.5}O_7$ (M=Nb, Ta, Sb), $(Bi)_{1-2}(Zn, Nb, Ta, Ti)_2O_7$, $(Ca, Ba, Sr, Pb)_{1-2}(Zn, Nb, Ta, Ti, Zr)_2O_7$, and $(Ca_{1-x}Sr_x)Bi_4Ti_4O_{15}$. Also, the high-K gate oxide layer can be obtained at low temperatures (below 300° C.) deposition, and can be annealed in air or oxygen atmosphere (below 300° C.) following room temperature deposition. In addition, the high-K gate oxide layer can have a thickness no greater than approximately 2000 nm. Moreover, high-K gate oxide layer can be comprised of an amorphous, nanocrystalline structure or a capacitor structure for flexible embedded capacitors. The transparent semiconductor can include a wide band gap oxide semiconductor at least one material selected from the group consisting ZnO, SnO2, In doped ZnO, Ga doped ZnO.

Bismuth zinc niobate $(Bi_{1.5}Zn_{1.0}Nb_{1.5}O_7$, $Bi_2(Zn_{1/3}Nb_{2/3})_2O_7$, $(Bi)_{1\sim2}(Zn, Nb, Ta, Ti)_2O_7)$ (BZN) with the pyrochlore structure has a high permittivity (~170), low loss (<4× $10^{-4}$), and high resistivity (~$3\times10^{13}$ Ωcm). BZN has been studied for microwave tunable devices, and films can be grown by physical deposition methods (sputtering and pulsed laser deposition) or by chemical deposition (chemical vapor deposition, atomic layer deposition, sol-gel process).

Figure 2:
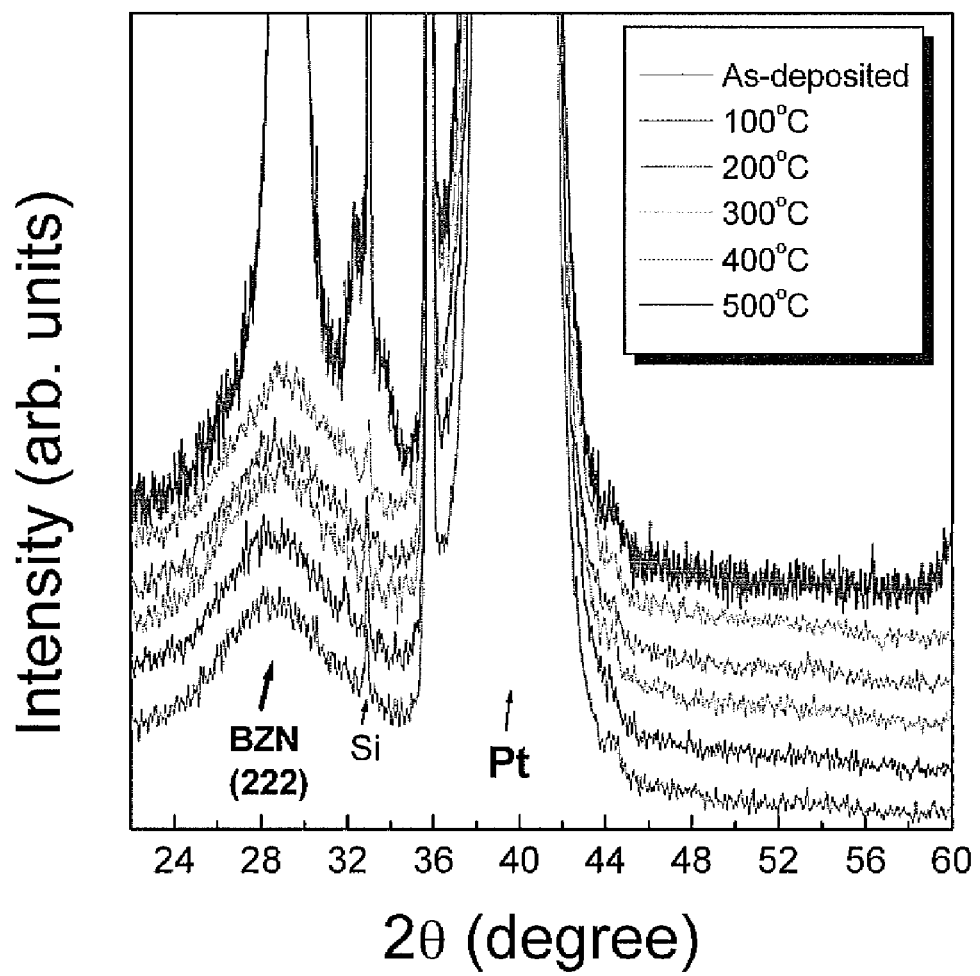
FIG. 2 illustrates an X-ray diffraction pattern for BZN thin films, showing only (222) peak of BZN film.

The BZN films are formed at high temperature more than 500° C. and showed crystalline pyrochlore structure. Here, room temperature process is adapted to obtain amorphous structure with higher degree of order. The high dielectric constant achievable with BZN, even when processed at room temperature, can be explained in detail on the basis of its crystallographic structure. FIG. 2 illustrates the X-ray diffraction pattern for BZN thin films, showing only (222) peak of BZN film with higher degree of order. Thin film perovskite films like (Ba, Sr)TiO$_3$ achieve good crystalline quality only at relatively elevated temperatures of around 600~800° C. Also, The BZN films include a high optical transmittance greater than 80%.

On the other hand, BZN films, with the cubic pyrochlore structure, tend to achieve good crystalline quality at much lower temperatures (e.g. typically >400° C.). Indeed, perovskite materials often first form pyrochlore phases requiring subsequent elevated temperature annealing to achieve the equilibrium perovskite phase. Also, high sintering temperature around 1300~1500° C. is required for perovskite phase like Pb(Zr, Ti)O$_3$, (Ba, Sr)TiO$_3$ etc. Also, BZN has cubic pyrochlore phase structure $A_2B_2O_7$ which is relatively well formed at lower temperature compared to perovskite structure. Indeed, the peak intensities of BZN films are slightly stronger than those of room temperature deposited BST films pointing to a higher degree of order in BZN.

Figure 3A:
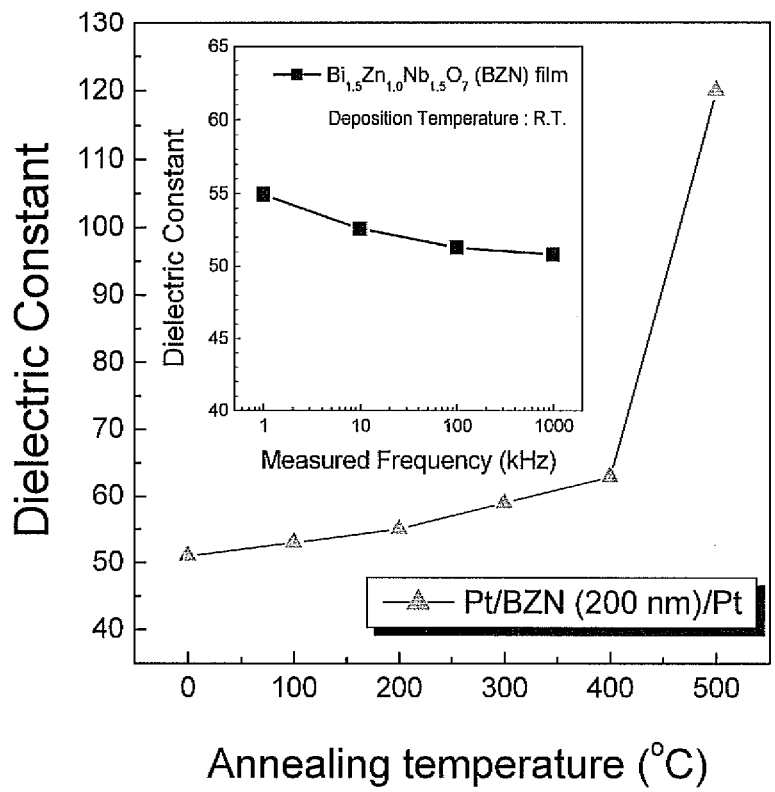
FIG. 3A is a graph showing the dielectric constant of BZN thin film (200 nm) as a function of annealing temperature.

FIG. 3A shows dielectric constant of BZN thin film (200 nm) as a function of annealing temperature. The dielectric constant increased with increasing annealing temperature, from 51 at room temperature to 120 at 500° C. The increase is likely correlated with formation of the pyrochlore phase and increase in crystallinity and grain size for higher annealing temperatures. The inset in FIG. 3A shows the dielectric constant-frequency characteristics of Pt/BZN/Pt capacitors grown at room temperature.

The relative dielectric constant of the BZN thin film is nearly frequency independent, i.e. ~55-51 in the frequency range between $10^3$ and $10^6$ Hz. MIM capacitor configuration showed low dielectric loss of 0.015 at 1 MHz. These represent potential application in plastic embedded capacitor. The high dielectric constant of these BZN films can be related to the ease with which the pyrochlore crystal structure forms at low temperature. This leads to a higher degree of short range order than that achieved by, e.g., perovskite-based oxides, and hence higher dielectric constants. Using BZN films, one can thus realize even lower operating voltages in OTFTs and thin film embedded capacitor.

Figure 3B:
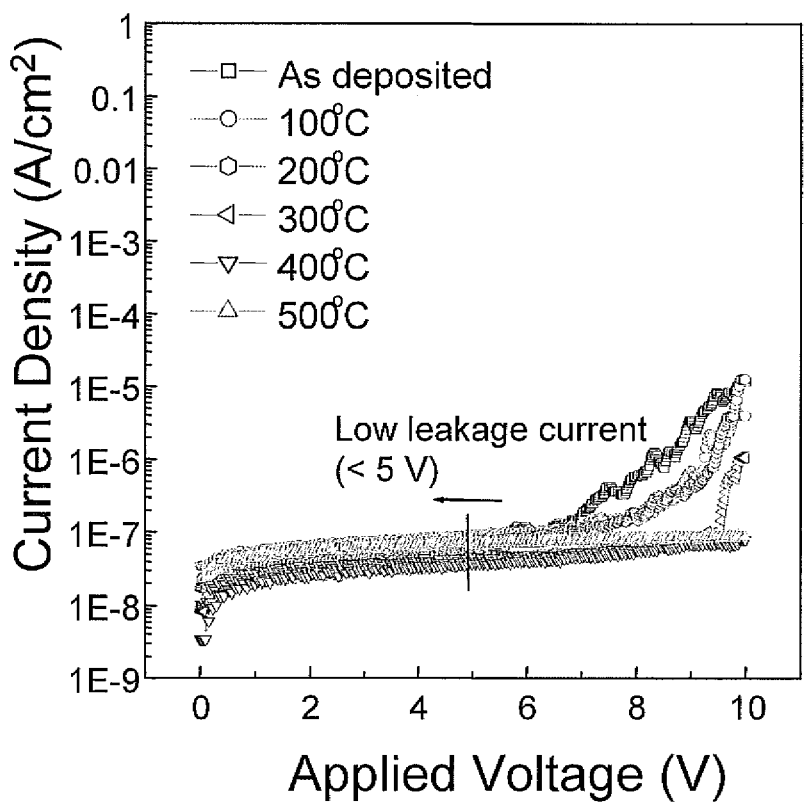
FIG. 3B is a graph showing the I-V characteristics of a BZN thin film as a function of annealing temperature.

FIG. 3B shows the I-V characteristics of a BZN thin film as a function of annealing temperature in a metal-insulator-metal (MIM) configuration utilizing Pt electrodes exhibiting excellent leakage current densities of less than $10^{-7}$ A/cm$^2$ for voltages below 5 V. As increasing annealing temperature, leakage current density decreased until 400° C. After crystallization of BZN film at 500° C., leakage current density slightly increased. The leakage current density increased for the film annealed more than 600° C. The results may be related to reactions at the electrode interface or loss of volatile species such as Bi.

One can also demonstrate that amorphous or nanocrystalline BZN films, obtained by a number of means including a) room-temperature deposition and/or b) low temperature (below 300° C.) deposition or c) annealing (below 300° C.) following room temperature deposition, exhibit good dielectric and current leakage characteristics and serve as excellent candidates for use as a transistor gate-dielectric and a high-K oxide for thin film embedded capacitor, as shown in FIG. 2.

Figure 4:
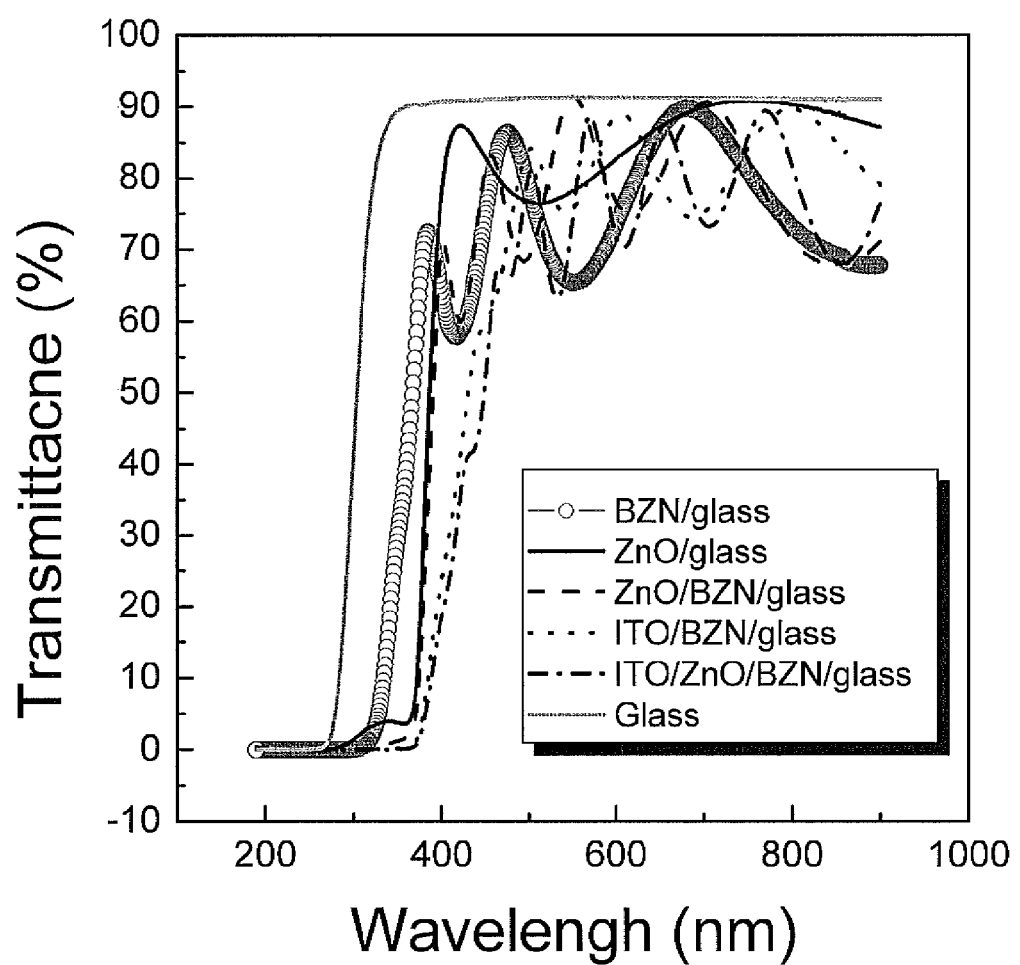
FIG. 4 is a graph illustrating the optical transmittance of the indicated structures as a function of wavelength.

FIG. 4 shows the optical transmission spectra of the indicated structures containing the BZN film in the wavelength range between 200 and 900 nm. To investigate the transmittance of the BZN film, BZN/glass structures were examined. For comparison with the transmittance of ZnO films, tin-doped indium oxide (ITO) films, used as electrodes in transparent TFTs, were also investigated as a reference. Further, to isolate the relative contributions to the optical loss of the overall structure, the transmittance of the glass substrate, ZnO/glass, ZnO/BZN/glass, ITO/BZN/glass, and ITO/ZnO/BZN/glass structures were investigated.

The BZN/glass structure showed an absorption edge at 310 nm, which is shorter than that of the ZnO/glass structure (360 nm) but higher than that of the glass (280 nm). The transmittance at higher wavelengths than the absorption edge had oscillations due to interference effects. The average transmittance value was around 80% in all structures measured. The transmittance of the BZN film was better than or at least comparable to that of the ZnO and ITO films, indicating that transmission losses due to the BZN gate dielectric in TFTs would be negligible.

FIG. 5A shows the drain-to-source current ($I_{DS}$) as a function of drain-to-source voltage ($V_{DS}$) of the ZnO TFT with BZN gate insulator. The TFTs, normally off, operate via the accumulation of carries. The carriers are electrons and the channel is n-type given that $I_{DS}$ becomes nonzero for positive $V_{GS}$. $I_{DS}$ at a $V_{GS}$ of 0 V is very small and the TFTs operates in the enhancement mode. The TFTs exhibited excellent current saturation with increasing $V_{DS}$. The large output impedance, achieved at saturation, is desirable in most electronics applications.

FIG. 5B shows the transfer curve of the ZnO TFT. The threshold voltage ($V_{th}$) and field effect mobility ($\mu_{FE}$) were calculated in the saturation region ($V_{GS}$=4 V) from, respectively, the slope and x-axis intercept of the square root of $I_{DS}$ vs $V_{GS}$ plot. $V_{th}$ and $\mu_{FE}$ were 2 V and 0.024 cm$^2$/Vs, respectively. The subthreshold swing (SS) of the TFT was 0.25 V/dec. The device operated at a low voltage, below 4 V, due to the high gate capacitance. On-current and off-current at the operating voltage of 4 V were $0.3\times10^{-6}$ A and $1.5\times10^{-11}$, respectively giving an on/off current ratio of $2\times10^4$. While the TFT operated at low voltage (<4V), it had relatively low $\mu_{FE}$ and hence low on-current and on/off ratio Room temperature processed high-K oxides with low dielectric loss and low leakage current density fabricated on plastic substrates or glass substrates can be used as TFT gate oxides to offer low voltage operation and insulator for embedded capacitor. AMOLED (active matrix organic light emitting diodes) displays have a transistor driver supplying a constant current source at each pixel with one switching TFTs to program. If one can fabricate transparent TFTs, bottom emissive structure will be realized.

Although the present invention has been shown and described with respect to several preferred embodiments thereof, various changes, omissions and additions to the form and detail thereof, may be made therein, without departing from the spirit and scope of the invention.

What is claimed is:

1. A transparent thin film transistor device comprising:
   a transparent substrate;
   a high dielectric constant insulator layer disposed over the transparent substrate at a defined temperature, said high dielectric constant insulator layer comprises at least one material selected from the group consisting of $Bi_2(Zn_{1/3}Nb_{2/3})_2O_7$, $Bi_{1.5}Zn_{1.0}M_{1.5}O_7$ (M=Nb, Ta, Sb), $(Bi)_{1~2}(Zn, Nb, Ta, Ti)_2O_7$, $(Ca, Ba, Sr, Pb)_{1~2}(Zn, Nb, Ta, Ti, Zr)_2O_7$, and $(Ca_{1-x}Sr_x)Bi_4Ti_4O_{15}$; and
   a transparent semiconductor layer disposed over the high dielectric constant insulator layer.

2. The transistor device of claim 1, wherein the transparent substrate comprises glass, PET, PEN, PES, or Polyimide.

3. The transistor device of claim 1, wherein the high dielectric constant insulator layer is formed at least one process selected from the group consisting of sputtering, pulsed laser deposition, evaporation, chemical vapor deposition, and atomic layer deposition.

4. The transistor device of claim 1, wherein the high dielectric constant insulator layer is deposited at room temperature.

5. The transistor device of claim 1, wherein the high dielectric constant insulator layer is obtained below 300° C. deposition.

6. The transistor device of claim 1, wherein the high dielectric constant insulator layer is annealed in air or oxygen atmosphere below 300° C. following room temperature deposition.

7. The transistor device of claim 1, wherein the high dielectric constant insulator layer comprises a thickness no greater than approximately 2000 nm.

8. The transistor device of claim 1, wherein the high dielectric constant insulator layer comprises an amorphous or a nanocrystalline structure.

9. The transistor device of claim 1, wherein the high dielectric constant insulator layer comprises a high optical transmittance greater than 80%.

10. The transistor device of claim 1, wherein the high dielectric constant insulator layer comprises a capacitor structure for flexible embedded capacitor.

11. The transistor device of claim 1, wherein the transparent semiconductor layer comprises wide band gap oxide semiconductor where at least one material selected from the group consisting of ZnO, SnO2, In doped ZnO, and Ga doped ZnO.

12. The method of claim 1, wherein the transparent substrate comprises glass, PET, PEN, PES, or Polyimide.

13. A method of developing a transparent thin film transistor device comprising:
    providing a transparent substrate;
    forming a high dielectric constant insulator layer disposed over the transparent substrate at a defined temperature, said high dielectric constant insulator layer comprises at least one material selected from the group consisting of $Bi_2(Zn_{1/3}Nb_{2/3})_2O_7$, $Bi_{1.5}Zn_{1.0}M_{1.5}O_7$ (M=Nb, Ta, Sb), $(Bi)_{1~2}(Zn, Nb, Ta, Ti)_2O_7$, $(Ca, Ba, Sr, Pb)_{1~2}(Zn, Nb, Ta, Ti, Zr)_2O_7$, and $(Ca_{1-x}Sr_x)Bi_4Ti_4O_{15}$; and
    forming a transparent semiconductor layer disposed over the high dielectric constant insulator layer.

14. The method of claim 13, wherein the high dielectric constant insulator layer is formed at least one process selected from the group consisting of sputtering, pulsed laser deposition, evaporation, chemical vapor deposition, and atomic layer deposition.

15. The method of claim 13, wherein the high dielectric constant insulator layer is deposited at room temperature.

16. The method of claim 13, wherein the high dielectric constant insulator layer is obtained below 300° C. deposition.

17. The method of claim 13, wherein the high dielectric constant insulator layer is annealed in air or oxygen atmosphere below 300° C. following room temperature deposition.

18. The method of claim 13, wherein the high dielectric constant insulator layer comprises a thickness no greater than approximately 2000 nm.

19. The method of claim 13, wherein the high dielectric constant insulator layer comprises an amorphous or a nanocrystalline structure.

20. The method of claim 13, wherein the high dielectric constant insulator layer comprises a high optical transmittance greater than 80%.

21. The method of claim 13, wherein the high dielectric constant insulator layer comprises a capacitor structure for flexible embedded capacitor.

22. The method of claim 13, wherein the transparent semiconductor comprises wide band gap oxide semiconductor where at least one material selected from the group consisting ZnO, SnO2, In doped ZnO, and Ga doped ZnO.

* * * * *